(12) United States Patent
Jhang et al.

(10) Patent No.: US 11,895,841 B2
(45) Date of Patent: Feb. 6, 2024

(54) MEMORY STRUCTURE AND MANUFACTURING METHOD FOR THE SAME

(71) Applicant: MACRONIX INTERNATIONAL CO., LTD., Hsinchu (TW)

(72) Inventors: Pei-Ci Jhang, Hsinchu County (TW); Chi-Pin Lu, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 326 days.

(21) Appl. No.: 17/485,636

(22) Filed: Sep. 27, 2021

(65) Prior Publication Data

US 2023/0100464 A1    Mar. 30, 2023

(51) Int. Cl.
*H01L 27/11568* (2017.01)
*H10B 43/30* (2023.01)
*H10B 43/20* (2023.01)

(52) U.S. Cl.
CPC .......... *H10B 43/30* (2023.02); *H10B 43/20* (2023.02)

(58) Field of Classification Search
CPC ....... H10B 43/30; H10B 43/20; H01L 29/512; H01L 29/40117
See application file for complete search history.

(56) References Cited

U.S. PATENT DOCUMENTS

| | | | |
|---|---|---|---|
| 6,828,623 B1 | 12/2004 | Guo et al. | |
| 7,279,740 B2 | 10/2007 | Bhattacharyya et al. | |
| 8,008,154 B2 | 8/2011 | Noh et al. | |
| 9,716,102 B2 | 7/2017 | Kim | |
| 9,882,018 B2 | 1/2018 | Choi | |
| 2008/0173930 A1* | 7/2008 | Watanabe | H01L 29/513 257/E21.21 |
| 2009/0057752 A1 | 3/2009 | Wang et al. | |
| 2009/0134450 A1 | 5/2009 | Kim et al. | |
| 2011/0101442 A1 | 5/2011 | Ganguly | |
| 2014/0073099 A1 | 3/2014 | Park et al. | |
| 2016/0043179 A1* | 2/2016 | Noh | H10B 43/27 257/314 |
| 2020/0091179 A1 | 3/2020 | Noguchi | |
| 2020/0212206 A1 | 7/2020 | Kim et al. | |

FOREIGN PATENT DOCUMENTS

CN     109300900 B     7/2020

* cited by examiner

*Primary Examiner* — Mohammed R Alam
(74) *Attorney, Agent, or Firm* — McClure, Qualey & Rodack, LLP

(57) ABSTRACT

A memory structure and a manufacturing method for the same are provided. The memory structure includes a charge trapping layer, a first silicon oxynitride tunneling film and a second silicon oxynitride tunneling film. The first silicon oxynitride tunneling film is between the charge trapping layer and the second silicon oxynitride tunneling film. A first atom concentration ratio of a concentration of a nitrogen atom to a total concentration of an oxygen atom and the nitrogen atom of the first silicon oxynitride tunneling film is 10% to 50%. A second atom concentration ratio of a concentration of a nitrogen atom to a total concentration of an oxygen atom and the nitrogen atom of the second silicon oxynitride tunneling film is 1% to 15%. The concentration of the nitrogen atom of the second silicon oxynitride tunneling film is lower than that of the first silicon oxynitride tunneling film.

11 Claims, 1 Drawing Sheet

MEMORY STRUCTURE AND MANUFACTURING METHOD FOR THE SAME

BACKGROUND

Technical Field

The disclosure relates to a memory structure and a manufacturing method for the same.

Description of the Related Art

A nonvolatile memory device is typically designed to securely hold data even when electrical power is lost or removed from the memory device. Various types of nonvolatile memory devices have been proposed in the related art. One of the technical development subjects is to improve data retention of the memory device.

SUMMARY

The present disclosure relates to a memory structure and a manufacturing method for the same.

According to an embodiment, a memory structure is disclosed. The memory structure comprises a charge trapping layer, a first silicon oxynitride tunneling film and a second silicon oxynitride tunneling film. The first silicon oxynitride tunneling film is between the charge trapping layer and the second silicon oxynitride tunneling film. A first atom concentration ratio of a concentration of a nitrogen atom to a total concentration of an oxygen atom and the nitrogen atom of the first silicon oxynitride tunneling film is 10% to 50%. A second atom concentration ratio of a concentration of a nitrogen atom to a total concentration of an oxygen atom and the nitrogen atom of the second silicon oxynitride tunneling film is 1% to 15%. The concentration of the nitrogen atom of the second silicon oxynitride tunneling film is lower than the concentration of the nitrogen atom of the first silicon oxynitride tunneling film.

According to another embodiment, a manufacturing method for a memory structure is disclosed. The manufacturing method comprises the following steps. A first silicon oxide film is formed. A charge trapping layer is formed. A first silicon oxynitride tunneling film is formed on the charge trapping layer. A second silicon oxynitride tunneling film is formed by performing an oxidation process applying a free radical to the first silicon oxynitride tunneling film.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
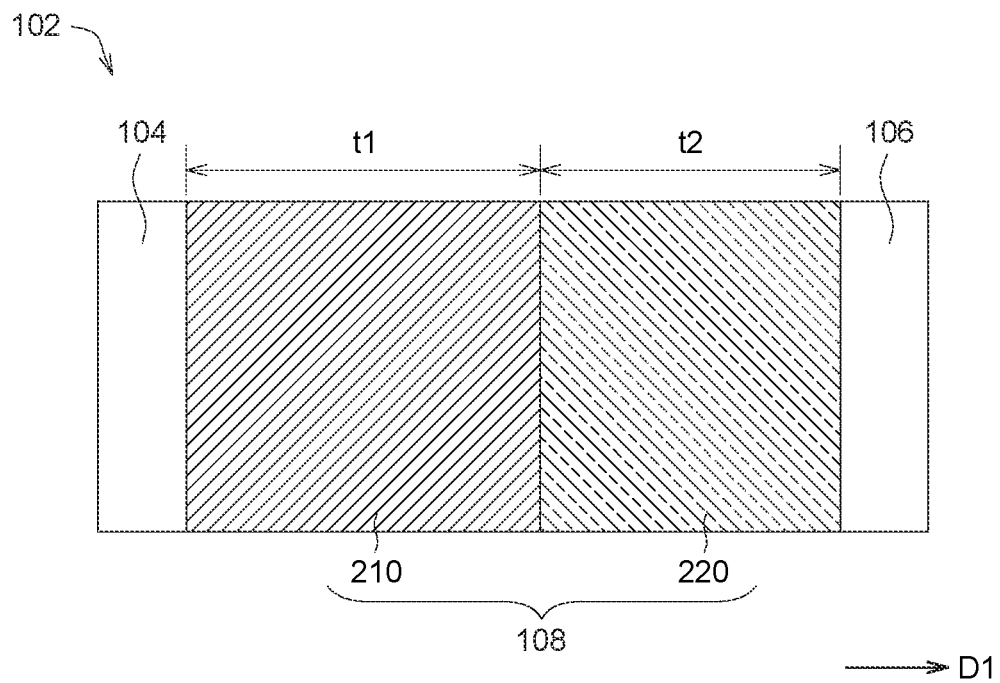
FIG. 1 illustrates a manufacturing method for a memory structure in an embodiment.

FIG. 1 illustrates a manufacturing method for a memory structure 102 in an embodiment. A first silicon oxynitride tunneling film 210 is formed on a charge trapping layer 104. A second silicon oxynitride tunneling film 220 is formed on the first silicon oxynitride tunneling film 210. A channel layer 106 is formed on the second silicon oxynitride tunneling film 220. A tunneling layer 108 comprises a silicon oxynitride tunneling layer. The silicon oxynitride tunneling layer comprises the first silicon oxynitride tunneling film 210 and the second silicon oxynitride tunneling film 220.

The first silicon oxynitride tunneling film 210 consists essentially of a silicon atom, an oxygen atom and a nitrogen atom. For example, the first silicon oxynitride tunneling film 210 may comprise silicon oxynitride ($SiO_xN_y$), such as SiON. The second silicon oxynitride tunneling film 220 may consist essentially of a silicon atom, an oxygen atom and a nitrogen atom.

In embodiments, the silicon oxynitride tunneling film 220 of the tunneling layer 108 is formed by performing a free radical oxidation process to the first silicon oxynitride tunneling film 210. As such, the barrier height of the silicon oxynitride tunneling film 220 is higher than the barrier height of the first silicon oxynitride tunneling film 210. In embodiments, a hydrogen ($H_2$) gas and an oxygen ($O_2$) gas may be introduced into a reaction chamber having a temperature of about 400° C. to 800° C., for example, to react to generate water vapor, and an oxygen radical (O*), a hydroxyl radical (OH*), and a hydrogen radical (H*). The generated free radical such as the hydroxyl radical (OH*) can oxidize the first silicon oxynitride tunneling film 210 in the reaction chamber so as to form the silicon oxynitride tunneling film 220 on the first silicon oxynitride tunneling film 210. The oxidation process for forming the silicon oxynitride tunneling film 220 may comprise a wet type oxidation process or a dry type oxidation process. The oxidation process may be performed by using a batch type furnace tool, or a single wafer type processing tool. Characteristics of the silicon oxynitride tunneling film 220, such as a thickness, an oxygen atom concentration distribution profile, a silicon atom concentration distribution profile, a nitrogen atom concentration distribution profile, etc., can be adjusted by parameters of the oxidation process, such as a reaction gas flow rate ratio, an oxidation process temperature, an oxidation process time, etc.

In embodiments, a first atom concentration ratio of a concentration of the nitrogen atom to a total concentration of the oxygen atom and the nitrogen atom of the first silicon oxynitrde tunneling film 210 is 10% to 50%, and in other words, a ratio of a concentration of the oxygen atom to a total concentration of the oxygen atom and the nitrogen atom of the first silicon oxynitride tunneling film 210 is 50% to 90%. Otherwise, the first atom concentration ratio of the concentration of the nitrogen atom to the total concentration of the oxygen atom and the nitrogen atom of the first silicon oxynitride tunneling film 210 is 15% to 40%, and in other words, the ratio of the concentration of the oxygen atom to the total concentration of the oxygen atom and the nitrogen atom of the first silicon oxynitride tunneling film 210 is 60% to 85%. Alternatively, the first atom concentration ratio of the concentration of the nitrogen atom to the total concentration of the oxygen atom and the nitrogen atom of the first silicon oxynitride tunneling film 210 is 20% to 30%, and in other words, the ratio of the concentration of the oxygen atom to the total concentration of the oxygen atom and the nitrogen atom of the first silicon oxynitride tunneling film 210 is 70% to 80%.

In embodiments, a second atom concentration ratio of a concentration of the nitrogen atom to a total concentration of the oxygen atom and the nitrogen atom of the second silicon oxynitride tunneling film 220 is 1% to 15%, and in other words, a ratio of a concentration of the oxygen atom to a total concentration of the oxygen atom and the nitrogen atom of the second silicon oxynitride tunneling film 220 is 85% to 99%. Otherwise, the second atom concentration ratio of the concentration of the nitrogen atom to the total concentration of the oxygen atom and the nitrogen atom of the second silicon oxynitride tunneling film 220 is 1% to 10%, and in other words, the ratio of the concentration of the oxygen atom to the total concentration of the oxygen atom and the nitrogen atom of the second silicon oxynitride tunneling film 220 is 90% to 99%. Alternatively, the second atom concentration ratio of the concentration of the nitrogen atom to the total concentration of the oxygen atom and the nitrogen atom of the second silicon oxynitride tunneling film 220 is 1% to 5%, and in other words, the ratio of the concentration of the oxygen atom to the total concentration of the oxygen atom and the nitrogen atom of the second silicon oxynitride tunneling film 220 is 95% to 99%.

In embodiments, the concentration of the nitrogen atom of the second silicon oxynitride tunneling film 220 is lower than the concentration of the nitrogen atom of the first silicon oxynitride tunneling film 210. In other words, the concentration of the oxygen atom of the second silicon oxynitride tunneling film 220 is larger than the concentration of the oxygen atom of the first silicon oxynitride tunneling film 210.

In embodiments, the concentration of the nitrogen atom of the second silicon oxynitride tunneling film 220 decreases gradually along a direction D1 away from the charge trapping layer 104. For example, the concentration of the nitrogen atom of the second silicon oxynitride tunneling film 220 decreases in gradient along the direction D1 away from the charge trapping layer 104.

In embodiments, the silicon oxynitride tunneling film 220 has the barrier height higher than the barrier height of the first silicon oxynitride tunneling film 210. Therefore, data retention of the memory structure 102 can be improved.

The first silicon oxynitride tunneling film 210 has a first thickness t1 (e.g. a size of a direction parallel to the direction D1. The second silicon oxynitride tunneling film 220 has a thickness t2. A thickness ratio of the first silicon oxynitride tunneling film 210 to the second silicon oxynitride tunneling film 220, i.e. t1/t2, is larger than 1, or larger than 1.5, or larger than 2.

The memory structure 102 may comprise a gate electrode layer and a data storage layer. The data storage layer includes a blocking layer, the charge trapping layer 104 and the tunneling layer 108, for example. The charge trapping layer 104 may be disposed between the blocking layer (not shown) and the tunneling layer 108. The blocking layer (silicon oxide layer, such as silicon dioxide ($SiO_2$)) may be disposed between the gate electrode layer (not shown) and the charge trapping layer 104. A memory cell of the memory structure 102 may be defined in the data storage layer between the gate electrode layer (not shown) and the channel layer 106 (such as polysilicon, etc.).

Figure 2:
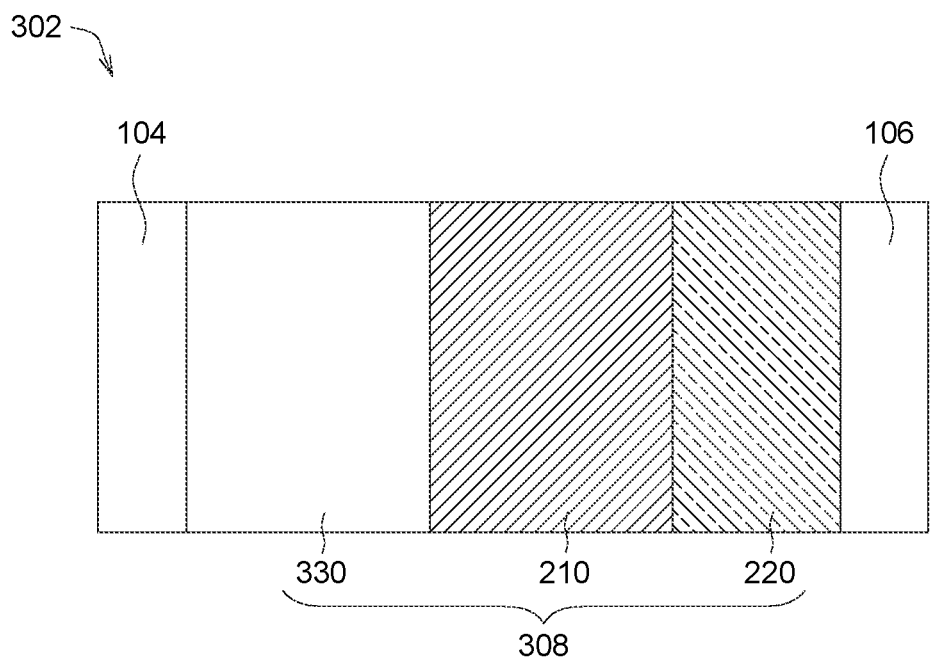
FIG. 2 illustrates a manufacturing method for a memory structure in another embodiment.

FIG. 2 illustrates a manufacturing method for a memory structure 302 in another embodiment, which is different from the embodiment illustrated with referring to FIG. 1 with the following description. A tunneling layer 308 of the memory structure 302 further comprises a silicon oxide tunneling layer 330 formed on the charge trapping layer 104. The silicon oxide tunneling layer 330 consists essentially of a silicon atom and an oxygen atom. The silicon oxide tunneling layer 330 may comprises silicon dioxide ($SiO_2$). The first silicon oxynitride tunneling film 210 is formed on the silicon oxide tunneling layer 330.

In a comparative example, a memory structure does not have the silicon oxynitride tunneling film 220 formed by performing the free radical oxidation process to the first silicon oxynitride tunneling film 210. The memory structure 102 and the memory structure 302 in embodiments have significantly better data retention than the memory structure (not shown) of the comparative example.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory structure, comprising:
  a charge trapping layer;
  a first silicon oxynitride tunneling film; and
  a second silicon oxynitride tunneling film, wherein the first silicon oxynitride tunneling film is between the charge trapping layer and the second silicon oxynitride tunneling film,
  a first atom concentration ratio of a concentration of a nitrogen atom to a total concentration of an oxygen atom and the nitrogen atom of the first silicon oxynitride tunneling film is 10% to 50%,
  a second atom concentration ratio of a concentration of a nitrogen atom to a total concentration of an oxygen atom and the nitrogen atom of the second silicon oxynitride tunneling film is 1% to 15%,
  the concentration of the nitrogen atom of the second silicon oxynitride tunneling film is lower than the concentration of the nitrogen atom of the first silicon oxynitride tunneling film.

2. The memory structure according to claim 1, wherein the concentration of the nitrogen atom of the second silicon oxynitride tunneling film gradually decreases along a direction away from the charge trapping layer.

3. The memory structure according to claim 1, wherein the first atom concentration ratio of the first silicon oxynitride tunneling film is 15% to 40%.

4. The memory structure according to claim 1, wherein the first atom concentration ratio of the first silicon oxynitride tunneling film is 20% to 30%.

5. The memory structure according to claim 1, wherein the second atom concentration ratio of the second silicon oxynitride tunneling film is 1% to 10%.

6. The memory structure according to claim 1, wherein the second atom concentration ratio of the second silicon oxynitride tunneling film is 1% to 5%.

7. The memory structure according to claim 1, further comprising a channel layer, wherein the second silicon oxynitride tunneling film is between the first silicon oxynitride tunneling film and the channel layer.

8. The memory structure according to claim 1, wherein a thickness ratio of the first silicon oxynitride tunneling film to the second silicon oxynitride tunneling film is larger than 1.

9. The memory structure according to claim 1, wherein the thickness ratio is larger than 1.5.

10. The memory structure according to claim 1, wherein the thickness ratio is larger than 2.

11. The memory structure according to claim 1, further comprising a silicon oxide tunneling layer between the charge trapping layer and the first silicon oxynitride tunneling film.

\* \* \* \* \*